United States Patent
Yang et al.

(10) Patent No.: US 8,278,140 B2
(45) Date of Patent: Oct. 2, 2012

(54) METHOD FOR PREPARING IGZO PARTICLES AND METHOD FOR PREPARING IGZO FILM BY USING THE IGZO PARTICLES

(75) Inventors: Ya-Hui Yang, Hsinchu (TW); Sueli Sidney Yang, Hsinchu (TW); Chen-Yu Kao, Hsinchu (TW); Kan-San Chou, Hsinchu (TW); Sinn-Wen Chen, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 299 days.

(21) Appl. No.: 12/591,767

(22) Filed: Dec. 1, 2009

(65) Prior Publication Data

US 2011/0097842 A1    Apr. 28, 2011

(30) Foreign Application Priority Data

Oct. 23, 2009   (TW) .............................. 98135888 A

(51) Int. Cl.
  *H01L 21/00*   (2006.01)
(52) U.S. Cl. ............... 438/104; 427/255.33; 427/255.34
(58) Field of Classification Search ................. 438/607, 438/608, 104; 427/255.33, 255.34
  See application file for complete search history.

(56) References Cited

U.S. PATENT DOCUMENTS

2010/0051938 A1 * 3/2010 Hayashi et al. ................. 257/43
* cited by examiner

*Primary Examiner* — Mary Wilczewski
*Assistant Examiner* — Toniae Thomas
(74) *Attorney, Agent, or Firm* — Bacon & Thomas, PLLC

(57) ABSTRACT

A method for preparing IGZO particles and a method for preparing an IGZO thin film by using the IGZO particles are disclosed. The method for preparing the IGZO particles comprises the following steps: (A) providing a solution of metal acid salts, which contains a zinc salt, an indium salt, and a gallium salt; (B) mixing the solution of the metal acid salts with a basic solution to obtain an oxide precursor; and (C) heating the oxide precursor to obtain IGZO particles.

19 Claims, 2 Drawing Sheets

METHOD FOR PREPARING IGZO PARTICLES AND METHOD FOR PREPARING IGZO FILM BY USING THE IGZO PARTICLES

BACKGROUND OF THE INVENTION

1. Field of the Invention

The present invention relates to a method for preparing Indium-Gallium-Zinc Oxide (IGZO) particles and a method for preparing an IGZO film by using the IGZO particles and, more particularly, to a method for preparing IGZO particles and a method for preparing an IGZO film by using the IGZO particles through a water-solution process.

2. Description of Related Art

The demands for electronic products are more and more various, and corresponding products with flexibility, transparency, and light weight are developed gradually. Currently, the commercialized thin film transistors (TFTs) are opaque TFTs. In order to produce transparent TFTs, the transmittance of the TFTs has to be improved.

Indium-Gallium-Zinc Oxide (IGZO) is used as one material for an active layer of the TFT. Nowadays, an amorphous IGZO film used as the active layer of the TFT is prepared by physical vaporized deposition (PVD) or a spurting process. However, the amorphous IGZO film has a disadvantage of insufficient transmittance, so it cannot be used for providing transparent TFT components. In addition, the processes and equipment used in the PVD and the sputtering process are very expensive, which leads the production cost of the TFT components to be high.

Further to the aforementioned amorphous IGZO film, a method for preparing poly-crystallized IGZO film by use of nano-sized IGZO particles is currently developed. Most nano-sized IGZO particles are prepared in organic solvents, and a high temperature process (>300° C.) is required for preparing a fine IGZO film. Although an IGZO film with high transmittance can be prepared from the organic solution and by the high temperature process, various studies have been tried to find other processes without using the organic solvents, to reduce the environmental pollution caused by the organic solvents.

Hence, in order to produce electronic products with transparency and flexibility and satisfy the requirements for environmental protection, it is desirable to develop a simple and eco-friendly process to prepare the material for the active layer of TFT component, and the obtained TFT component can still exhibit good electrical properties.

SUMMARY OF THE INVENTION

The object of the present invention is to provide a method for preparing IGZO, and nano-sized IGZO particles can be prepared in a water solution by the method of the present invention.

Another object of the present invention is to provide a method for preparing an IGZO film by using the IGZO particles prepared above. An IGZO film with high transmittance can be obtained by using the method of the present invention. Further, the obtained IGZO film can be used as an active layer of a TFT component.

To achieve the object, the method for preparing IGZO comprises the following steps: (A) providing a solution of metal acid salts, which contains a zinc salt, an indium salt, and a gallium salt; (B) mixing the solution of the metal acid salts with a basic solution to obtain an oxide precursor; and (C) heating the oxide precursor to obtain IGZO particles.

The method for preparing IGZO of the present invention is accomplished by a neutralization of the acidic salts and the basic solution, and a hydrothermal process to prepare the IGZO particles. Therefore, the method of the present invention is more eco-friendly, compared to the conventional method for preparing IGZO by using organic solvents.

According to the method for preparing IGZO of the present invention, the IGZO is represented by the following formula (I):

$x(Ga_2O_3)\text{-}y(In_2O_3)\text{-}z(ZnO)$ (I)

wherein, $0.75 < x/z < 3.15$, and $0.55 < y/z < 1.70$. Preferably, the IGZO is approximately represented by the following formula (II):

$InGaZn_2O_5$ (II).

The method for preparing IGZO of the present invention further comprises a step (B1) after the step (B): washing the oxide precursor.

In addition, according to the method for preparing IGZO of the present invention, the oxide precursor can be heated at 150° C. to 250° C.; and the oxide precursor can be heated for 30 min to 2 hr in the step (C).

In the method for preparing IGZO of the present invention, the diameters of the IGZO particles can be adjusted by controlling the pH value in the neutralization, the temperature and time in the hydrothermal process; and thereby the IGZO particles with nano-size can be obtained. Therefore, by using the method for preparing IGZO of the present invention, the diameters of the IGZO particles can be controlled in a range of 10 nm~750 nm.

According to the method for preparing IGZO of the present invention, the metal acid salts can be selected from the group consisting of metal nitrates, metal sulfides, metal chlorides, metal sulfites, metal phosphates, metal phosphites, and a combination thereof. Preferably, the metal acid salts are metal nitrate. More preferably, the solution of the metal acid salts comprises zinc nitrate ($Zn(NO_3)_2$), indium nitrate ($In(NO_3)_3$), and gallium nitrate ($Ga(NO_3)_3$).

According to the method for preparing IGZO of the present invention, the basic solution can be selected from the group consisting of ammonium hydroxide, NaOH solution, KOH solution, $Ca(OH)_2$ solution, $Mg(OH)_2$ solution, and a combination thereof. Preferably, the basic solution is ammonium hydroxide.

In addition, the present invention further provides a method for preparing an IGZO film, which comprises: (a) preparing an IGZO suspension containing IGZO particles, a dispersant, and water; (b) coating a substrate with the IGZO suspension; and (c) baking the substrate coated with the IGZO suspension, to obtain an IGZO film on the substrate.

According to the method for preparing the IGZO film of the present invention, the IGZO particles are prepared by the aforementioned method for preparing IGZO, and a simple and low temperature baking process is performed to prepare a fine IGZO film. Compared with the conventional method for preparing an IGZO film, the method of the present invention does not have to be performed at high temperature (>300° C.), so the temperature of the process can be decreased greatly to satisfy the purpose of saving energy. In addition, the method for preparing the IGZO film of the present invention does not require performance of a sputtering process, so the cost and complexity of the process can also be reduced.

The method for preparing the IGZO film of the present invention further comprises a step (d) after the step (c): treating the IGZO film by an annealing process. Preferably, the annealing process is performed by using a low temperature laser. The wavelength of the laser can be 200 nm~400 nm; the pulse can be 20 Hz~50 Hz; the pulse energy can be 5 mJ/cm$^2$~50 mJ/cm$^2$; and the pulse duration can be 0.1 sec~100 sec.

According to the method for preparing the IGZO film of the present invention, the low temperature laser annealing process is performed after the baking process to increase the electrical properties of the TFT component. Furthermore, when the wavelength, the pulse, the pulse energy, and the pulse duration of the laser are properly controlled, the electrical properties of the TFT component can be improved greatly.

The method for preparing the IGZO film of the present invention further comprises a step (a1) after the step (a): milling the IGZO suspension. Furthermore, in the step (b), the substrate can be coated with the IGZO suspension through spin coating, roll coating, printing, or inkjet coating. Preferably, the spin coating is used to coat the substrate with the IGZO suspension.

According to the method for preparing the IGZO film of the present invention, the substrate coated with the IGZO suspension is baked at 85° C. to 99° C. in the step (c).

In addition, according to the method for preparing the IGZO film of the present invention, the content of the IGZO particles can be 1 wt % to 20 wt % based on the total weight of the IGZO suspension. Preferably, the content of the IGZO particles is 5 wt % to 15 wt % based on the total weight of the IGZO suspension. More preferably, the content of the IGZO particles is 8 wt % to 12 wt % based on the total weight of the IGZO suspension.

Furthermore, according to the method for preparing the IGZO film of the present invention, the diameters of the IGZO particles can be 10 nm to 750 nm. Preferably, the diameters of the IGZO particles are 10 nm to 500 nm. More preferably, the diameters of the IGZO particles are 10 nm to 300 nm.

According to the method for preparing the IGZO film of the present invention, the dispersant can be selected from the group consisting of sodium carboxymethyl cellulose (CMC), sodium tripolyphosphate ($Na_5P_3O_{10}$), sodium hexametaphosphate, sodium pyrophosphate, tris-(2-ethylhexyl)phosphate, sodium dodecyl sulfate, methylpentanol, poly-acrylamide, polyethylene glycol fatty acid ester, and a combination thereof. Preferably, the dispersant is sodium carboxymethyl cellulose.

Additionally, according to the method for preparing the IGZO film of the present invention, the IGZO is approximately represented by the following formula (II):

$$InGaZn_2O_5 \quad\quad\quad (II).$$

The present invention further provides a method for manufacturing a TFT component by using the aforementioned methods, which comprises the following steps: (A) providing a substrate having a gate formed thereon; (B) forming a gate insulating layer on the substrate and the gate electrode; (C) depositing a metal layer over the gate insulating layer, and patterning the metal layer to form a source, a drain, and a channel between the source and the drain; (D) coating the channel with an IGZO suspension; and (E) baking the substrate coated with the IGZO suspension, to obtain an IGZO film used as an active layer. Furthermore, the method for preparing the TFT component may further comprise a step (F): treating the active layer by an annealing process.

The active layer formed with the IGZO film, which is prepared by the method for preparing the IGZO film of the present invention, has high transmittance. Hence, the method for preparing the TFT component of the present invention is suitable for manufacturing a transparent TFT component.

DETAILED DESCRIPTION OF THE PREFERRED EMBODIMENT

Preparing IGZO Particles 0.001 mole of zinc nitrate hexahydrate ($Zn(NO_3)_2$) (Riedel dehaen, Germany), 0.001 mole of indium nitrate hydrate (In($NO_3$)$_3$) (Alfa Aesar, USA), and 0.001 mole of gallium nitrate hydrate ($Ga(NO_3)_3$) (Alfa Aesar, USA) were dissolved in 100 ml of deionized water to obtain a solution of metal acid salts; and 0.008 mole of $NH_4OH$ was dissolved in 100 ml of deionized water to obtain a basic solution.

The solution of the metal acid salts was added into the basic solution to co-precipitate an oxide precursor in a gel form. Then, the oxide precursor was separated by centrifuge and rinsed with deioniezed water for three times.

Finally, the rinsed oxide precursor was dissolved in 20 ml of deionized water, placed into an autoclave, and heated at 200° C. for 1 hr to obtain IGZO powders. The formula of the IGZO powders is $InGaZn_2O_5$.

Preparing an IGZO Suspension

The obtained IGZO powders were dissolved in deionized water, and 1 wt % of sodium carboxymethyl cellulose (CMC) (Wako, Japan) as a dispersant was added therein to obtain an IGZO suspension. The solid content of IGZO in the IGZO suspension was 10 wt %.

The IGZO suspension was detected by Laser Diffraction Scattering (LDS), and the diameters of the IGZO powders in the IGZO suspension were about 200 nm.

Preparing a TFT Component

In the present embodiment, an active layer of a TFT component was manufactured by using the aforementioned IGZO suspension. The process for manufacturing the TFT is described as follows.

Figure 1A:
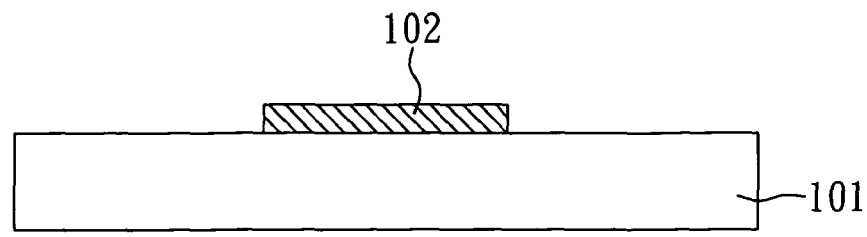
FIGS. 1A-1D are cross-sectional views for illustrating a process of manufacturing a TFT component in a preferred embodiment of the present invention.

First, as shown in FIG. 1A, a glass substrate 101 was provided, and a gate 102 is formed on the glass substrate 101. The gate 102 was formed by sputtering NiCr on the glass substrate 101 and using a mask (not shown in the figure) to define the pattern of the gate 102. In the present embodiment, the thickness of the gate 102 was about 100 nm.

Figure 1B:
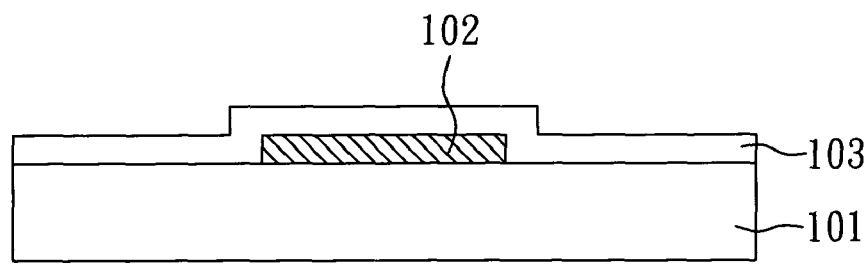

Then, $SiO_2$ was sputtered on the glass substrate 101 and the gate 102 to form a gate insulating layer 103, as shown in FIG. 1B.

Figure 1C:
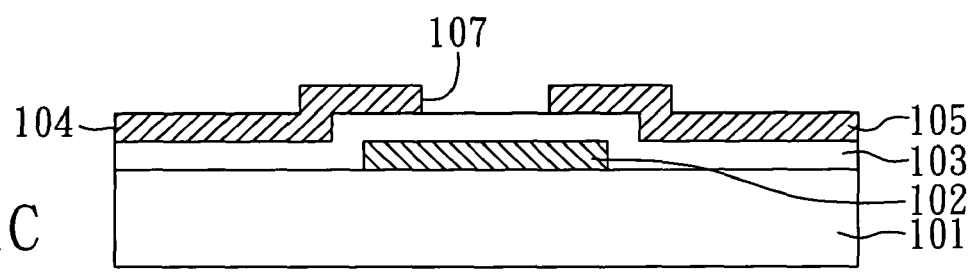
Figure 1D:
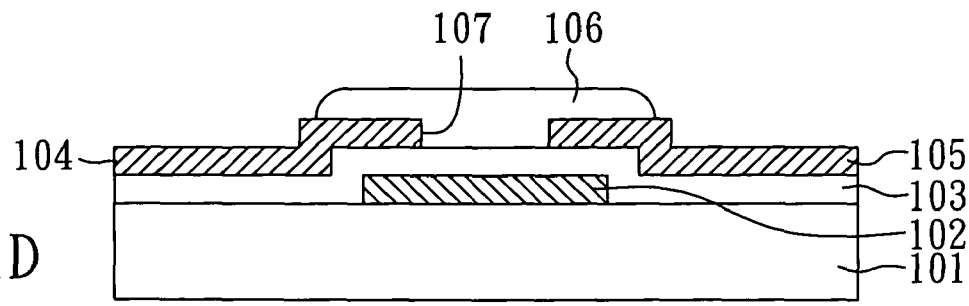

As shown in FIG. 1C, an Au layer was deposited and defined to form a source 104 and a drain 105, and the thickness of the source 104 and the drain 105 were about 300 nm. Also, a channel 107 with a width of 50 μm was formed between the source 104 and the drain 105.

The gate insulating layer 103, the source 104, the drain 105, and the channel 107 were coated with the aforementioned IGZO suspension through a spin coating process. Then, the resulting substrate was baked in an oven at 95° C. for 1 min to form an active layer 106 with a thickness of 300 nm. The active layer 106 formed in the present embodiment was a transparent IGZO film formed by poly-crystallized IGZO.

Finally, a low-temperature laser annealing process was performed over the active layer, and a TFT component of the present embodiment was obtained. During the laser annealing process, the wavelength of the laser was 200 nm~400 nm; the pulse was 20 Hz~50 Hz; the pulse energy was 5 mJ/cm$^2$~50 mJ/cm$^2$; and the pulse duration was 0.1 sec~100 sec.

After the transmittance of the active layer of the TFT component was evaluated, the IGZO film with a thickness of 300 nm prepared in the present embodiment has a transmittance over 85%.

Evaluation of the Electrical Properties of the TFT Component

Figure 2:
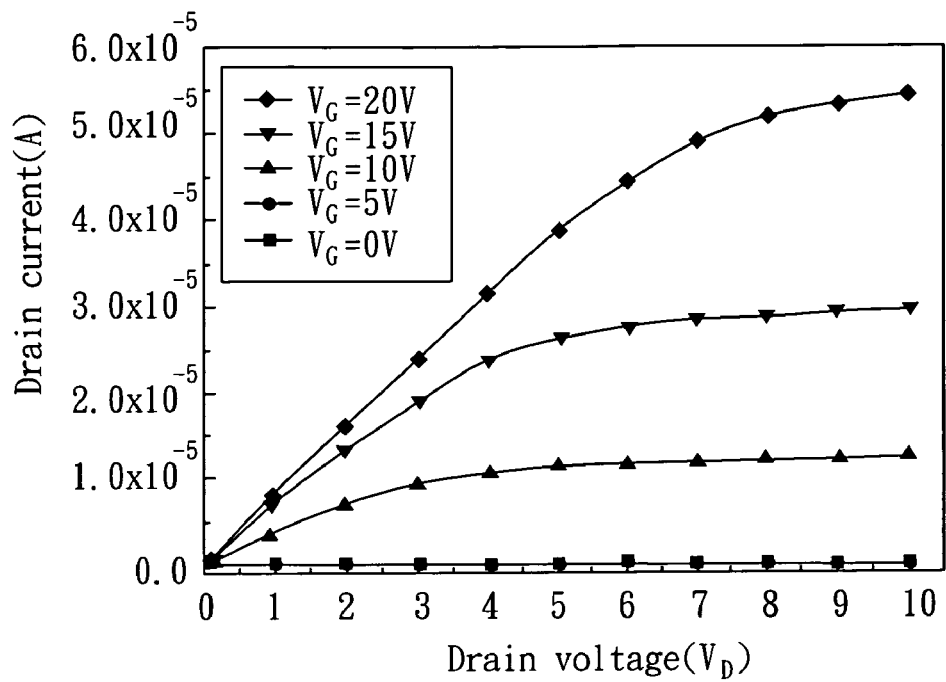
FIG. 2 is a test chart showing the transfer characteristics of a TFT component in a preferred embodiment of the present invention.

The evaluation results about the transfer characteristic of the TFT component prepared in the present embodiment are shown in FIG. 2. When the voltages of the source and the drain were 10V, the $I_{on}$ was $10^{-5}$ A. In addition, the field-effect mobility of the TFT component prepared in the present embodiment is 2.3 cm$^2$/V-s.

Figure 3:
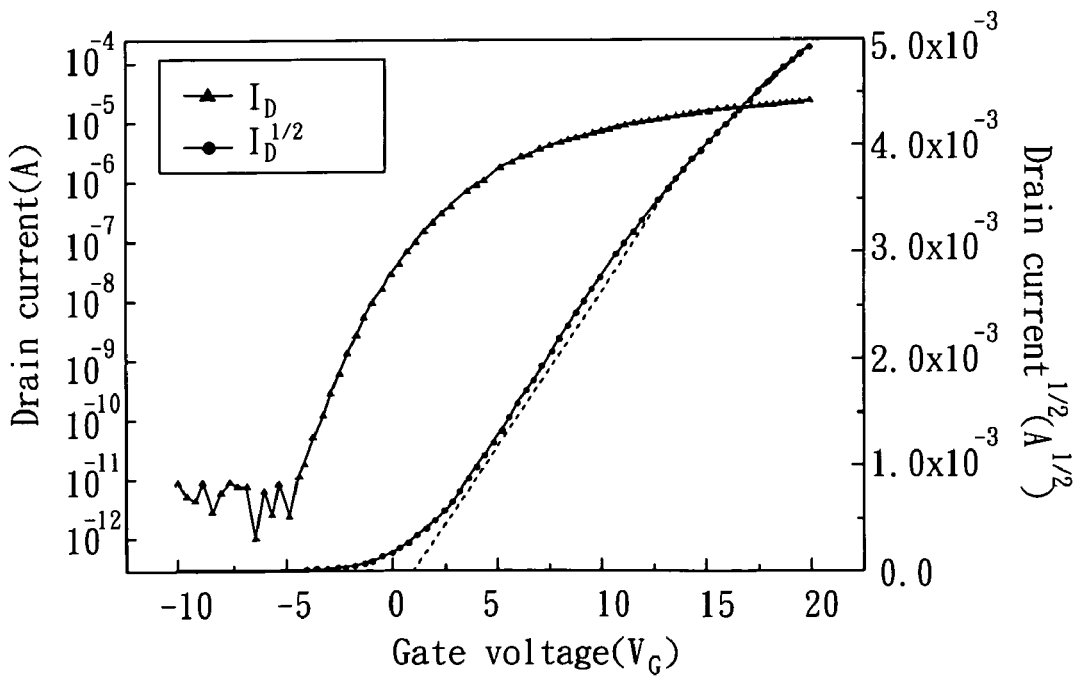
FIG. 3 is a test chart showing the transfer characteristics of an active layer of a TFT component in a preferred embodiment of the present invention.

FIG. 3 shows the transfer characteristics of the active layer of the TFT component prepared in the present embodiment. After calculation, the current on-to-off ration ($I_{on}/I_{off}$) was over $10^6$, when the voltages of the source and the drain were 10V.

In conclusion, according to the method for preparing IGZO particles and the method for preparing IGZO film by using the IGZO particles of the present invention, the production cost and the process complexity for preparing TFTs can be greatly reduced because a water-solution process and a low temperature process are used in the methods of the present invention. Also, the evaluation results show that the TFT component prepared according to the methods of the present invention has good electrical properties. In addition, a water-solution process, a low-temperature process for preparing IGZO film, and a low-temperature laser annealing process used in the methods of the present invention are suitable for preparing flexible substrates. Hence, the methods of the present invention can be applied to prepare transparent and/or flexible TFTs.

Although the present invention has been explained in relation to its preferred embodiment, it is to be understood that many other possible modifications and variations can be made without departing from the scope of the invention as hereinafter claimed.

What is claimed is:

1. A method for preparing IGZO, comprising the following steps:
    (A) providing a solution of metal acid salts, which contains a zinc salt, an indium salt, and a gallium salt;
    (B) mixing the solution of the metal acid salts with a basic solution to obtain an oxide precursor; and
    (C) heating the oxide precursor to obtain IGZO particles.

2. The method as claimed in claim 1, further comprising a step (B1) after the step (B): washing the oxide precursor.

3. The method as claimed in claim 1, wherein the oxide precursor is heated at 150° C. to 250° C. in the step (C).

4. The method as claimed in claim 1, wherein the oxide precursor is heated for 30 min to 2 hr in the step (C).

5. The method as claimed in claim 1, wherein the metal acid salts are selected from the group consisting of metal nitrates, metal sulfides, metal chlorides, metal sulfites, metal phosphates, metal phosphites, and a combination thereof.

6. The method as claimed in claim 1, wherein the solution of the metal acid salts comprises zinc nitrate, indium nitrate, and gallium nitrate.

7. The method as claimed in claim 1, wherein the basic solution is selected from the group consisting of ammonium hydroxide, NaOH solution, KOH solution, Ca(OH)$_2$ solution, Mg(OH)$_2$ solution, and a combination thereof.

8. The method as claimed in claim 1, wherein the basic solution is ammonium hydroxide.

9. The method as claimed in claim 1, wherein the diameters of the IGZO particles are 10 nm to 750 nm.

10. A method for preparing an IGZO film, comprising the following steps:
    (a) preparing an IGZO suspension containing IGZO particles, a dispersant, and water;
    (b) coating a substrate with the IGZO suspension; and
    (c) baking the substrate coated with the IGZO suspension, to obtain an IGZO film on the substrate.

11. The method as claimed in claim 10, further comprising a step (d) after the step (c): treating the IGZO film by an annealing process.

12. The method as claimed in claim 11, wherein the annealing process is performed by a laser annealing.

13. The method as claimed in claim 10, wherein the content of the IGZO particles is 1 wt% to 20 wt% based on the total weight of the IGZO suspension.

14. The method as claimed in claim 10, wherein the diameters of the IGZO particles are 10 nm to 750 nm.

15. The method as claimed in claim 10, wherein the dispersant is selected from the group consisting of sodium carboxymethyl cellulose, sodium tripolyphosphate, sodium hexametaphosphate, sodium pyrophosphate, tris-(2-ethylhexyl) phosphate, sodium dodecyl sulfate, methylpentanol, polyacrylamide, polyethylene glycol fatty acid ester, and a combination thereof.

16. The method as claimed in claim 10, wherein the dispersant is sodium carboxymethyl cellulose.

17. The method as claimed in claim 10, further comprising a step (a1) after the step (a): milling the IGZO suspension.

18. The method as claimed in claim 10, wherein the substrate is coated with the IGZO suspension through spin coating, roll coating, printing, or inkjet coating in the step (b).

19. The method as claimed in claim 10, wherein the substrate coated with the IGZO suspension is baked at 85° C. to 99° C. in the step (c).

* * * * *